United States Patent
Nakamura

(10) Patent No.: US 6,892,027 B2
(45) Date of Patent: May 10, 2005

(54) IMAGE PROJECTOR, PROJECTED IMAGE PATTERN, LASER DRIVER, IMAGING DEVICE

(75) Inventor: Makibi Nakamura, Tokyo (JP)

(73) Assignee: Sony Corporation, Tokyo (JP)

( * ) Notice: Subject to any disclaimer, the term of this patent is extended or adjusted under 35 U.S.C. 154(b) by 154 days.

(21) Appl. No.: 10/203,117

(22) PCT Filed: Dec. 5, 2001

(86) PCT No.: PCT/JP01/10620

§ 371 (c)(1),
(2), (4) Date: Jan. 21, 2003

(87) PCT Pub. No.: WO02/46820

PCT Pub. Date: Jun. 13, 2002

(65) Prior Publication Data

US 2003/0147050 A1 Aug. 7, 2003

(30) Foreign Application Priority Data

| Dec. 7, 2000 | (JP) | ........................................ 2000-373075 |
| Sep. 5, 2001 | (JP) | ........................................ 2001-269177 |
| Sep. 5, 2001 | (JP) | ........................................ 2001-269178 |

(51) Int. Cl.$^7$ ............................................. G03B 13/18
(52) U.S. Cl. ......................... 396/106; 396/431; 348/370
(58) Field of Search ......................... 396/106–113, 431

(56) References Cited

U.S. PATENT DOCUMENTS 5,485,235 A * 1/1996 Meyers ........................ 396/106
5,569,904 A 10/1996 Meyers ........................ 250/201.8
5,701,015 A * 12/1997 Lungershausen et al. 250/495.1

FOREIGN PATENT DOCUMENTS

| EP | 0 693 700 | 1/1996 | ............ G02B/7/32 |
| JP | 61-48883 | 3/1986 | ............ G03H/1/18 |
| JP | 8-54559 | 2/1996 | ............ G02B/7/32 |
| JP | 10-254337 | 9/1998 | ............ G03H/1/22 |
| JP | 11-353422 | 12/1999 | .......... G06K/17/00 |

* cited by examiner

Primary Examiner—W. B. Perkey
(74) Attorney, Agent, or Firm—Frommer Lawrence & Haug LLP; William S. Frommer

(57) ABSTRACT

Image projection apparatus wherein, a focusing lens is controlled when a shutter is operated so that a contrast signal, obtained when a luminance signal from a camera signal processing circuit is supplied to an auto focusing detection circuit, may become maximum. A laser diode is driven to generate laser beams that are condensed into parallel laser beams by a condenser. These parallel laser beams are applied to a hologram plate and thereby diffracted. The diffracted laser beams interfere with each other, to produce a hologram image with sufficient contrast. Therefore, satisfactory focusing can be made in an auto focus mode of the contrast detection system or in a manual focus mode.

5 Claims, 13 Drawing Sheets

IMAGE PROJECTOR, PROJECTED IMAGE PATTERN, LASER DRIVER, IMAGING DEVICE

TECHNICAL FIELD

The present invention relates to an image projection apparatus, a projection image pattern, a laser drive apparatus and a camera apparatus fit for use in an electronic still camera, for example. Particularly, the present invention relates to an image projection apparatus, a projection image pattern, a laser drive apparatus and a camera apparatus each of which helps focusing adjustment when a user takes a picture, for example, in the dark.

BACKGROUND ART

When a user takes a picture by a still camera, for example, in the dark because it is difficult for a user to visually confirm an object, the object cannot be brought into focus by an auto focus camera, for example, of a contrast detection type. It is also difficult to bring the object into focus in a manual focus mode. To solve this problem, there has been employed so far a method which enables an auto focusing operation by irradiating the object with an auxiliary floodlight such as an LED. According to this method, however, when an object has low contrast, it used to be difficult to bring the object into focus.

On the other hand, for example, a floodlight for producing a large output required for obtaining the brightness enough to focus on the object consumes large electric power and thus produces such a great deal of heat that the floodlight cannot be used near the object. Alternatively, there is known, for example, a method in which light is condensed by a lens to floodlight an object. However, when light is condensed into a narrow area in order to increase the brightness of an object, if a user takes a picture using a wide-angle lens, then a floodlighted area will be too narrow to make focusing easily. Conversely, if the floodlighted area is made so wide as corresponds to that in the wide-angle photographing, a sufficient brightness of the object cannot be obtained disadvantageously.

Further, while there is employed an auxiliary floodlight in which a lens and a slit are placed in front of an LED or an electric bulb, etc. to project an image of the slit onto the object, a projected image has low contrast, so that satisfactory focusing is made difficult. Moreover, according to this method, light loss is unavoidably produced in the floodlight due to the slit, and hence electric power consumption for obtaining a necessary quantity of light is extremely large. As a result, it is difficult for the above-mentioned auxiliary floodlight to be incorporated into, for example, a small electronic still camera and driven by a power supply such as a built-in battery.

Aside from these prior arts, there has been proposed an image projection apparatus in which an arbitrary hologram reproduced image is projected by using, for example, a laser light source and a hologram plate. Such hologram reproduced image can enhance contrast of a projected image. Accordingly, it is conceived that this hologram reproduced image is projected onto an object to be made use of focusing. That is to say, the detection in the manual focus mode or in the auto focus mode is performed using the hologram reproduced image that is projected onto the object.

However, the image projection apparatus is such that a hologram plate is added to the existing so-called "laser pointer", the structure of which is shown in FIGS. 14A and 14B, for example. Specifically, as shown in FIG. 14A, a laser light source 71 for generating light of diffused laser beams and a condenser 72 for converting the light of diffused laser beams to light of parallel laser beams are provided within a lens barrel 70. The light of parallel laser beams converted by this condenser 72 is used as a laser pointer for indicating an arbitrary point and so on.

A hologram plate 73 is provided within a lens barrel 74 which is fitted onto the lens barrel 70. Then, when the light of parallel laser beams is applied to this hologram plate 73, a hologram reproduced image is formed and projected onto the object. However, in this image projection apparatus, the laser light source 71 and the condenser 72 are integrated with each other as a single unit by the lens barrel 70, and the hologram plate 73 of the lens barrel 74 is added to this unit thus formed. When the lens barrel 74, for example, is broken, there is a risk that only the hologram plate 73 may be detached from the unit.

Accordingly, when the hologram reproduced image is projected onto the object to be used for focusing as described above, if only the hologram plate 73 is detached from the unit and the light of parallel laser beams from the condenser 72 is directly applied to the object as shown in FIG. 14B, then the object, for example, a man will feel discomfort due to a dazzling light of parallel laser beams if he sees it. When the hologram plate 73 is present, the hologram reproduced image is formed and hence light of laser beams is diffused, so that the discomfort given to a man will be alleviated.

The present invention is made in view of the aforesaid points and the problems to be solved is as follows: When a user takes a picture by a still camera in the dark, for example, it is difficult for the user to focus in the auto focus mode of the contrast detection system or in the manual focus mode. On the other hand, the camera apparatus using the conventional auxiliary floodlight does not allow a satisfactory focusing to be performed. Moreover, because the conventional auxiliary floodlight consumes large power, it cannot be incorporated into a small electronic still camera for use.

Furthermore, the image projection apparatus using, for example, the laser light source and the hologram plate has a risk that, when the hologram plate is detached and so forth, a man as an object will feel uncomfortable very much due to a dazzling light of parallel laser beams if he sees it.

DISCLOSURE OF INVENTION

The present invention seeks to facilitate the focalization when a user takes a picture, for example, in the dark. For this purpose, the present invention is arranged to project onto the object the hologram reproduced image which is obtained by using the laser light source and the hologram plate. In this connection, there will be disclosed below an image projection apparatus, a projection image pattern, a laser drive apparatus and a camera apparatus according to the present invention.

BEST MODE FOR CARRYING OUT THE INVENTION

An image projection apparatus, a projection image pattern, a laser drive apparatus and a camera apparatus according to the present invention will be described below with reference to the drawings, FIG. 1 of which is a block diagram showing structures of an image projection apparatus and a camera apparatus according to an embodiment of the present invention.

Figure 1:
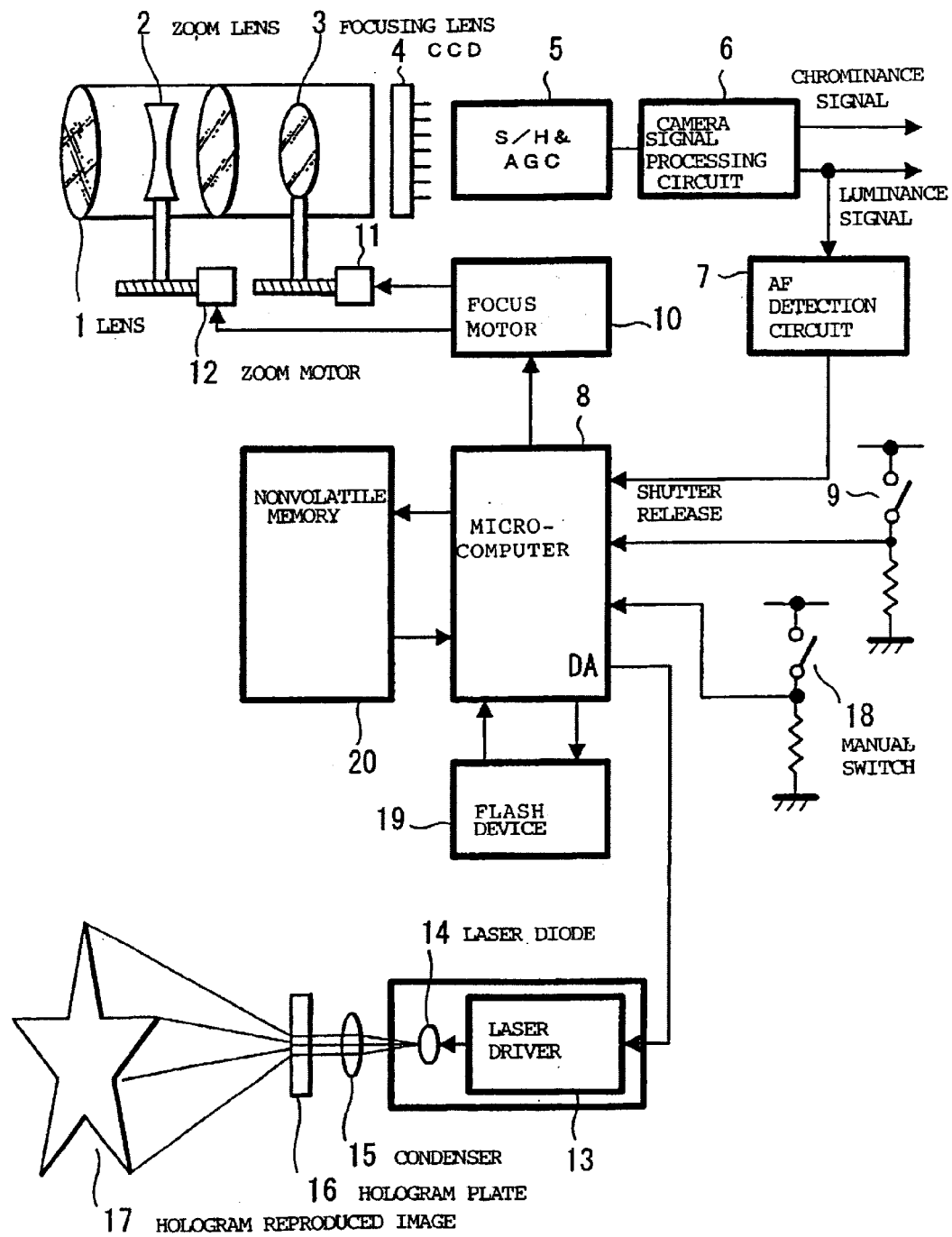
FIG. 1 is a block diagram showing an embodiment of an image projection apparatus and a camera apparatus according to the present invention.

Referring to FIG. 1, image light from an object (not shown), for example, is condensed through a main lens 1, a zoom lens 2 and a focusing lens 3 and an object image is brought into focus on a charge coupled device (hereinafter abbreviated to "CCD") 4 serving as an image pickup means. This object image is photoelectrically converted by the CCD 4 and further converted into a digital signal by a sample/hold and gain control (hereinafter abbreviated to "S/H & AGC") circuit 5.

This digital signal is further converted into a chrominance signal and a luminance signal by a camera signal processing circuit 6 and then outputted to a signal recording system, not shown. The luminance signal from this camera signal processing circuit 6 is supplied to an auto focusing (hereinafter abbreviated to "AF") detection circuit 7, in which a contrast signal necessary for AF is generated using this luminance signal. Then, the contrast signal thus generated is supplied to a microcomputer (hereinafter abbreviated to "micon") 8 for use in control operations.

Thus, if the micon 8 detects that a shutter release 9, for example, is half depressed, then the micon controls the focusing lens 3 so as to make the above-mentioned contrast signal maximum in level for AF operation. The focusing lens 3 may be controlled by sending an amount signal to a motor driver circuit 10 for driving a focus motor 11. Similarly, the zoom lens 2 may be controlled by sending an amount controlling signal to the motor driver circuit 10 for driving a zoom motor 12.

A control signal is supplied from the micon 8 to a laser driver 13, whereby a laser diode 14 is driven to generate light of laser beams only while this control signal is supplied from the micon to the laser driver. The light of laser beams thus generated is condensed by a condenser 15 into light of parallel laser beams and the light of parallel laser beams is applied to a hologram plate 16, in which the light of parallel laser beams is diffracted by a hologram provided in the hologram plate 16. Then, the laser beams thus diffracted are caused to interfere with each other, thereby making a hologram reproduced image 17 reproduced.

As a result, this hologram reproduced image 17 can be projected onto the object which lies, for example, in the optical axis direction of the main lens 1. In this case, if the hologram reproduced image 17 is composed of segments, then an area where the image is projected can be decreased as compared with a projection range. Thus, an image with high contrast can be projected to increase illuminance of the object. In other words, by projecting the image with high contrast onto the object, satisfactory focusing can be done with ease.

Additionally, the means (apparatus) itself for projecting the above-mentioned hologram reproduced image 17 is readily available as an auxiliary device for use with the existing laser pointer, for example, which apparatus can easily be formed by applying such device thereto. Because the laser diode 14 for use with such laser pointer can be driven with extremely small power consumption, such laser diode can be incorporated, for example, into a small electronic still camera, and can easily be driven by a built-in battery and the like.

There is further provided a manual switch 18 for controlling a manner in which the hologram reproduced image 17 is projected onto the object. When this manual switch 18 is operated, a high potential signal is supplied to the micon 8. Further, a control signal from the micon 8 is supplied to a flash device 19 so that the light emission of the flash device 19 may be controlled by this control signal as needed. Moreover, data corresponding to measured values and controlled values generated within the micon 8 are stored in a nonvolatile memory (e.g., EEPROM) 20.

Figure 2:
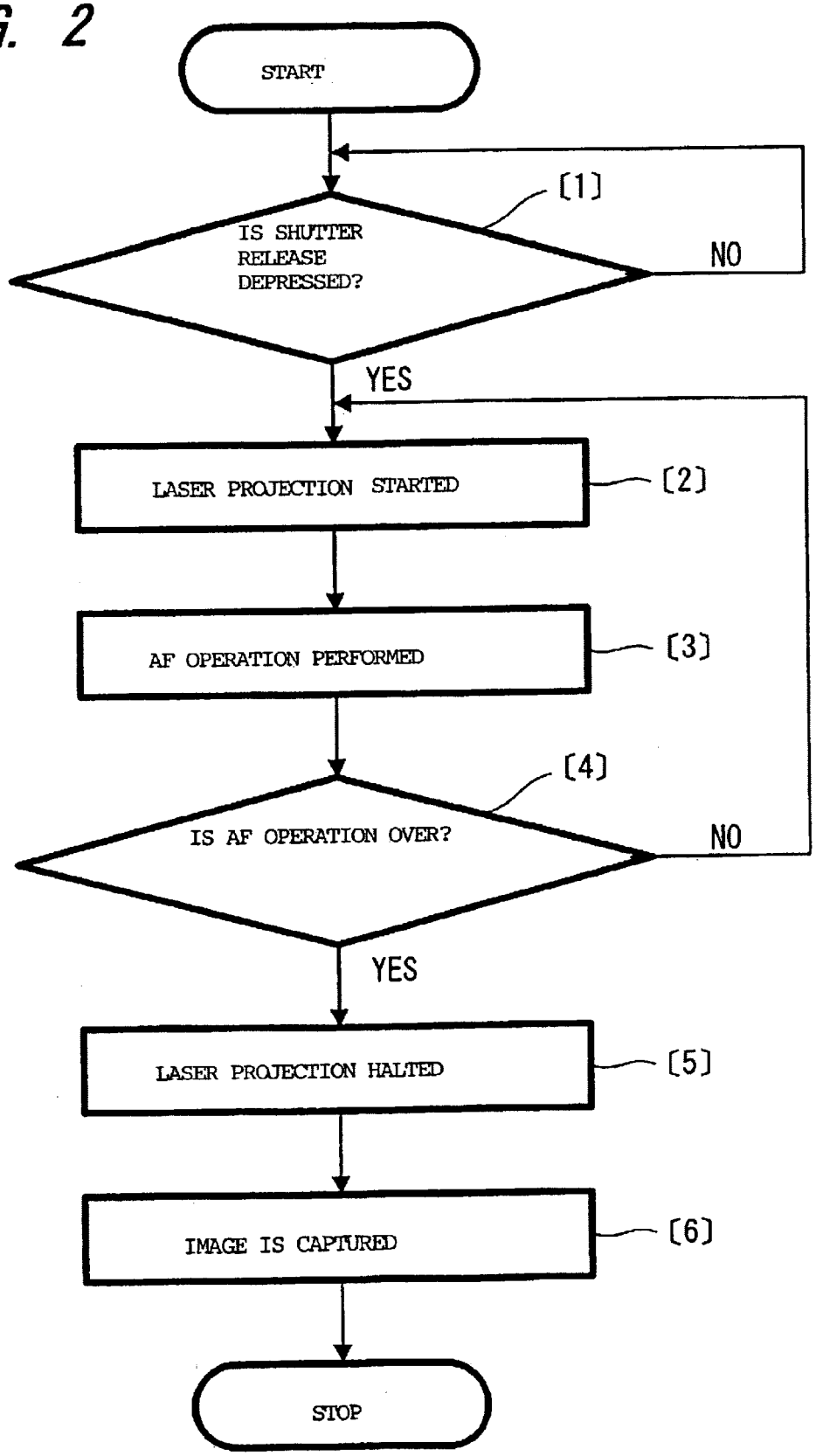
FIG. 2 is a flow chart for explaining an operation of the embodiment.

FIG. 2 shows a flow chart of exemplary processings executed when the auto focusing operation is performed by the above-mentioned apparatus. Specifically, in FIG. 2, following the start of operation, it is first determined at a step [1] whether or not the shutter release 9 is half depressed. If it is not depressed (No), then this step [1] is repeated. If it is determined at the step [1] that the shutter release 9 is depressed (Yes), then the laser diode 14 is driven at a step [2] to start the projection of laser beams.

At a step [3], the AF operation is performed and it is determined at a step [4] whether or not the AF operation is over. If the AF operation is not over (No), then the steps [2], [3] are repeated. If it is determined at the step [4] that the AF operation is over (Yes), then the laser diode 14 is deactivated to halt the projection of light of laser beams. At a step [6], for example, the flash device is activated to capture an image (photograph) and the processing is stopped.

The processings are executed in this manner when the above-mentioned apparatus is applied to the auto focusing operation. In this case, while the AF operation is performed at the step [3], the hologram reproduced image 17 which is reproduced at the step [2] is projected onto the object, and hence an extremely satisfactory AF operation can be performed using this hologram reproduced image 17. Because the projection of this hologram reproduced image 17 is halted at the step [5] when the image is captured (photographed), this hologram reproduced image will never hinder the user from taking a picture.

Figure 3:
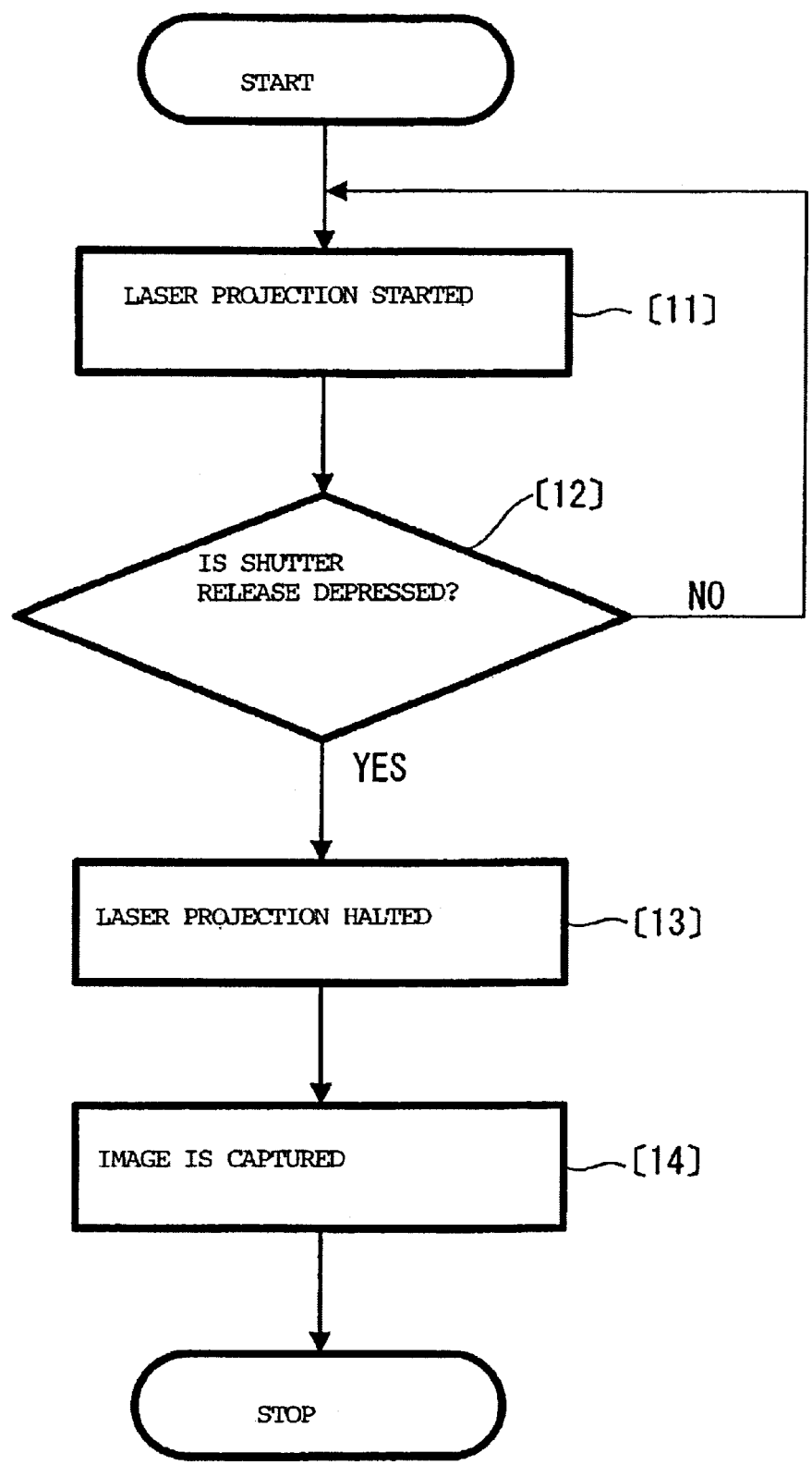
FIG. 3 is a flow chart for explaining another operation of the embodiment.

FIG. 3 is a flow chart showing exemplary processings executed when the above-mentioned apparatus is used in the manual focus mode. In this case, for example, when the manual switch 18 of the above-mentioned apparatus is operated, the processing is started. Following the start of operation, at a step [11], the laser diode 14 is driven first to start the projection of light of laser beams. It is determined at the next step [12] whether or not the shutter release 9 is half depressed.

If it is determined at the step [12] that the shutter release 9 is not depressed (No), then the manual focus mode is not over, and hence the steps [11], [12] are repeated. On the other hand, if the manual focus mode is over and it is determined at the step [12] that the shutter release 9 is depressed (Yes), then the laser diode 14 is deactivated to halt the projection of light of laser beams at a step [13]. Then, an image is captured (photographed) at a step [14] and the processing is stopped.

The processings are executed in this manner, when the above-mentioned apparatus is used in the manual focus mode. In this case, because the hologram reproduced image 17 which is reproduced at the step [11] is projected onto the object, a user can make an extremely satisfactory manual focusing by visually confirming this hologram reproduced image 17. Because this hologram reproduced image 17 is turned off at the step [13] when the image is captured (photographed), this hologram reproduced image will never hinder the user from taking a picture.

Accordingly, in this embodiment, because the hologram reproduced image obtained by using the laser light source and the hologram plate is projected onto the object, the hologram reproduced image having sufficient contrast can be projected onto the object by small power consumption. Thus, satisfactory focusing can be done in the auto focus mode of the contrast detection system or in the manual focus mode. At the same time, this apparatus can easily be incorporated into, for example, a small electronic still camera.

As described above, when a user takes a picture by a still camera, for example, in the dark, it is difficult for the user to focus in the auto focus mode of the contrast detection system or in the manual focus mode. On the other hand, the user not can make sufficient focusing with the camera apparatus using the conventional auxiliary floodlight. Furthermore, the conventional auxiliary floodlight consuming a large amount of electric power cannot be incorporated into a small electric still camera or the like. According to the present invention, these problems can be overcome with ease.

Figure 4:
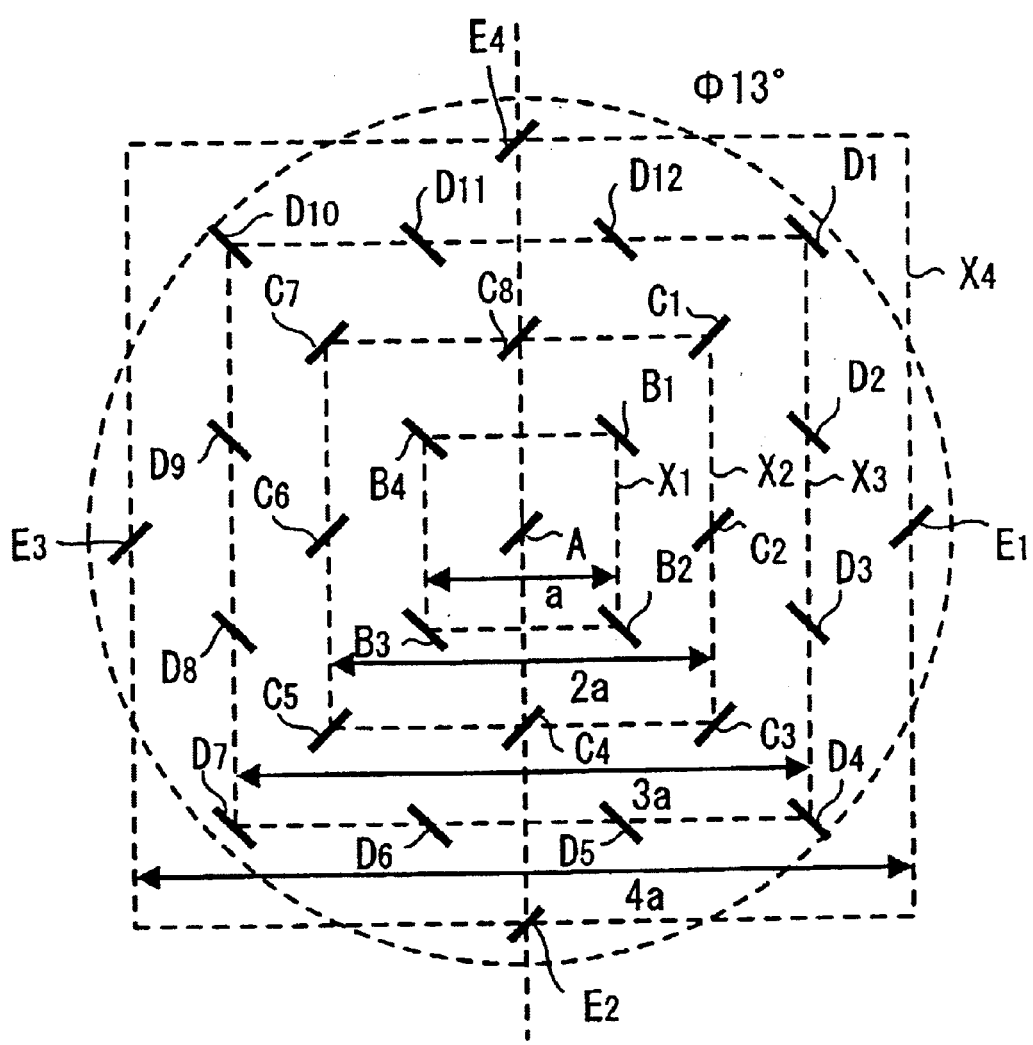
FIG. 4 is a diagram showing an embodiment of a projection image pattern according to the present invention.

In the above-mentioned apparatus, as the projection image pattern of the hologram reproduced image for use in projection, such one shown in FIG. 4 is used, for example. FIG. 4 shows a projection image pattern according to an embodiment of the present invention. As shown in FIG. 4, the projection image pattern is comprised of at least one or a plurality of first to fifth segments A to E on each of which a predetermined number of light spots are arrayed in a straight line. The first segment A is provided at the center of the projection image at an angle of approximately 45 degrees with horizontal and vertical axes of the image pickup plane.

There are provided four second segments $B_1$ to $B_4$, at right angles with the first segment A, at each vertex of a square $X_1$ which circumscribes a circle that is centered at the center of the first segment A and has a predetermined length of diameter a ($X_1$ is shown by broken lines: the square shown by broken lines is not a projection image pattern and hereinafter the same applies.). There are further provided eight third segments $C_1$ to $C_8$, in parallel with the first segment A, at each vertex and at a midpoint in each side of a square $X_2$ (shown by broken lines) which circumscribes a circle that is centered at the center of the first segment A and has a diameter 2a twice the predetermined length a.

There are also provided twelve fourth segments $D_1$ to $D_{12}$, at right angles with the first segment A, at each vertex and at points trisecting each side of a square $X_3$ (shown by broken lines) which circumscribes a circle that is centered at the centre of the first segment A and has a diameter 3a three times the predetermined length a. There are further provided four fifth segments $E_1$ to $E_4$, in parallel with the first segment A, at a midpoint of each side of a square $X_4$ (shown by broken lines) which circumscribes a circle that is centered at the center of the first segment A and has a diameter 4a four times the predetermined length a. In this way, the projection image pattern composed of twenty-nine segments in total is formed.

In this projection image pattern, each of the segments A to E is comprised of, for example, a fifteen light spots, arrayed in a straight line. The length of these segments A to E are set at 0.8 degree by a projection angle, for example. The central spot of the arrayed light spots is removed from the segment A. Specifically, a hologram for making the segments A to E shown in FIG. 4 into a reproduced image is found by calculation, and the hologram based upon this calculation is provided on the hologram plate 16.

The circle having a diameter of the predetermined length a, which is inscribed in the square $X_1$, is set at, e.g. three degrees by a projection angle. As a result, a projection angle of the circle which is inscribed in the square $X_2$ will be six degrees; a projection angle of the circle which is inscribed in the square $X_3$ will be nine degrees; and a projection angle of the circle which is inscribed in the square $X_4$ will be twelve degrees. In this case, a pattern within the circle which is inscribed, e.g. in the square $X_2$ is comprised of seven segments substantially. Thus, an output of the laser diode 14 is set so that the quantity of heat produced when light corresponding to the seven segments strikes man's retina may be less than the value of safety standards.

Figure 5:
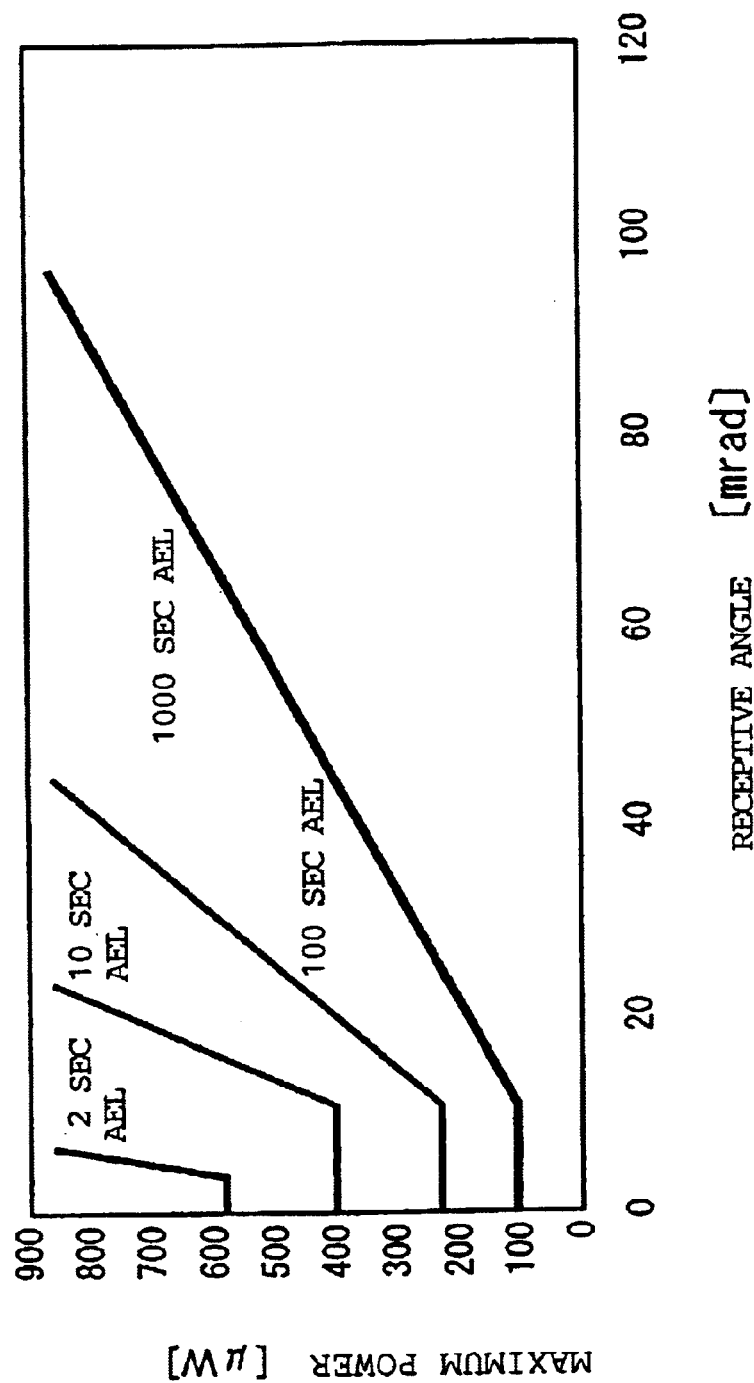
FIG. 5 is a graph for explaining the pattern.

Therefore, according to this embodiment of the projection image pattern, even if positions of view points are moved under the respective projection angles, the heat generated will never exceed the value of safety standards. FIG. 5 is a graph showing the relation between the maximum powers and receptive angles with respect to heat generated, which was found by simulation. As this figure shows, even continuous generation of laser beams conforms to the safety standards of 1000 second AEL of the class 1 of the JIS.

Moreover, according to the embodiment of the above-mentioned projection image pattern, because the angles of adjacent segments are alternately changed from each other, the substantial space between the segments can be reduced by the distance of half the length of the segment. Therefore, when the detection range of the auto focus is, e.g. about 3 degrees in terms of the projection angle, even if the optical axis of a camera lens is not coincident with the center of the projection image pattern, it is possible to remove such a risk that no segment will fall within the detection range.

Furthermore, in the above embodiment of the projection image pattern, the central light spot is removed from the light spots forming the first segment A located at the center. As a consequence, although in the hologram reproduced image zero-order light may sometimes be generated at the center of the image in addition to an original image pattern, a brightness of the light spot at the center of the first segment A can be prevented from being raised due to such zero-order light, thus allowing a satisfactory detection to be done. Even if the light spot at the center of the first segment has no brightness, there is no risk that the detection, e.g. in the auto focus mode may be interfered with.

Figure 6:
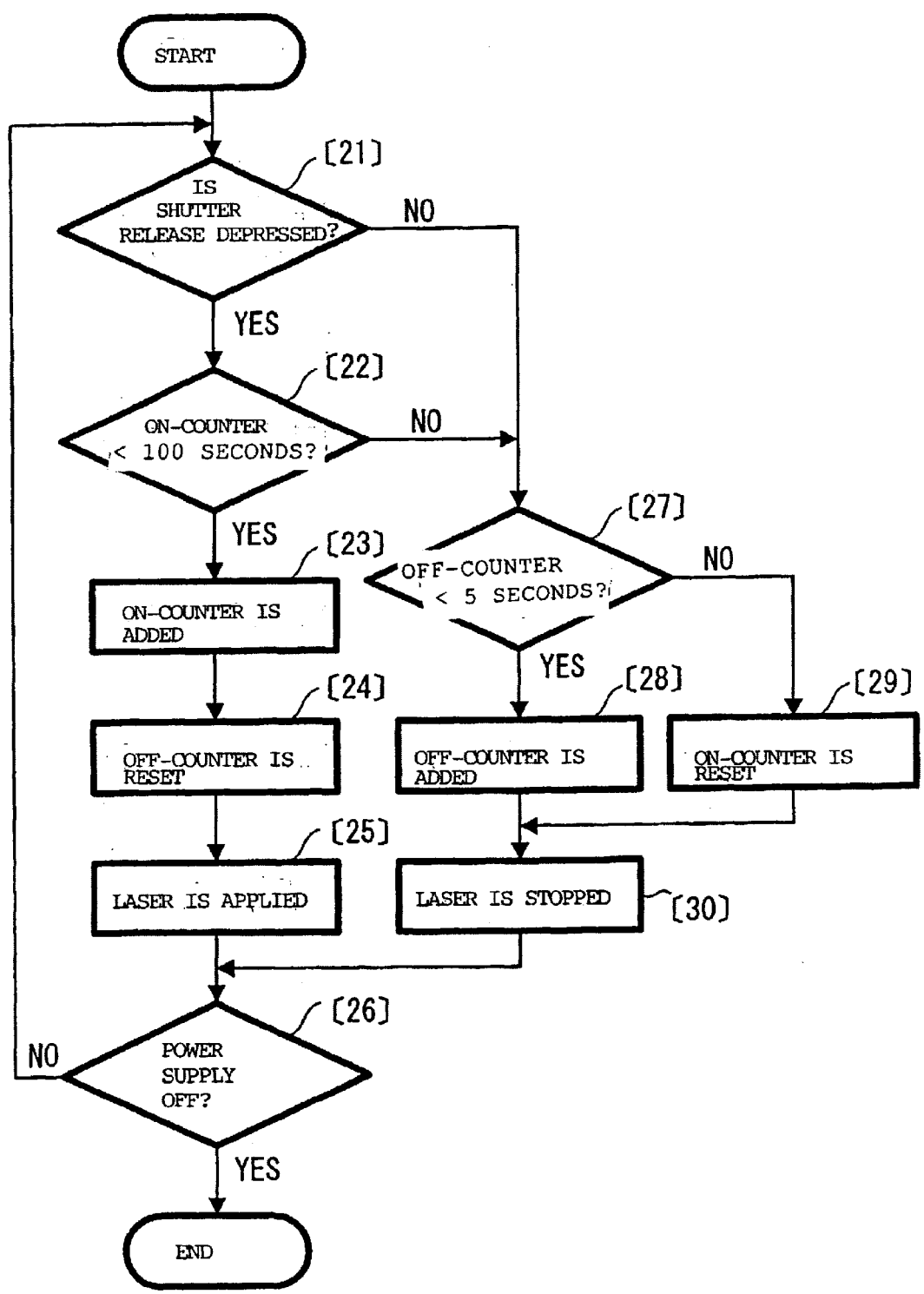
FIG. 6 is a flow chart showing an operation of a laser drive apparatus according to an embodiment of the present invention.

In the above-mentioned apparatus, the laser diode 14 is driven as shown in FIG. 6. That is, FIG. 6 is a flow chart showing exemplary operations of the laser drive apparatus according to an embodiment of the present invention.

Referring to FIG. 6, upon the start of operation, it is first determined at a step [21] whether or not the shutter release 9 is half depressed. If it is depressed (Yes), it is determined at a step [22] whether or not a value of "on-counter" of an arbitrary register is less than 100 seconds. If the on-counter value is less than 100 seconds (Yes), a predetermined value is added to the on-counter value at a step [23]. A value of an "off-counter" of an arbitrary register is reset to zero at a step [24], and the application of light of laser beams is maintained at a step [25].

It is further determined at a step [26] whether or not a command for making the power supply off is issued. If such command for making the power supply off is issued (Yes), then the operation comes to an end (End). If it is determined that no command for making the power supply off is issued (No), then the operation is returned to the step [21]. If it is determined at the step [21] that the shutter release 9 is not depressed (No) and if it is determined at the step [22] that the on-counter value is not less than 100 seconds (No), then it is determined at a step [27] whether or not the off-counter value is less than five seconds.

If it is determined at the step [27] that the off-counter value is less than five seconds (Yes), then a predetermined value is added to the off-counter value at a step [28]. If it is determined at the step [27] that the off-counter value is not less than five seconds (No), then the on-counter value is reset to zero at a step [29]. After the steps [28] and [29] have been finished, the application of light of laser beams is stopped at a step [30], and it is determined at the step [26] whether or not the command for making the power supply off should be issued.

Accordingly, in this flow chart, when the on-counter value goes greater than 100 seconds, the application of light of laser beams is stopped. Besides, while the off-counter value remains less than five seconds, the on-counter value is not reset. Therefore, the apparatus is operated so that duration in which the application of light of laser beams is stopped may always be five seconds or longer. Thus, when the light of laser beams, for example, is applied continuously, an output of the apparatus can be prevented from falling due to heat and the like. As a consequence, it is possible to eliminate a radiator plate or the like that has so far been used as a conventional countermeasure against the heat generation.

Figure 7:
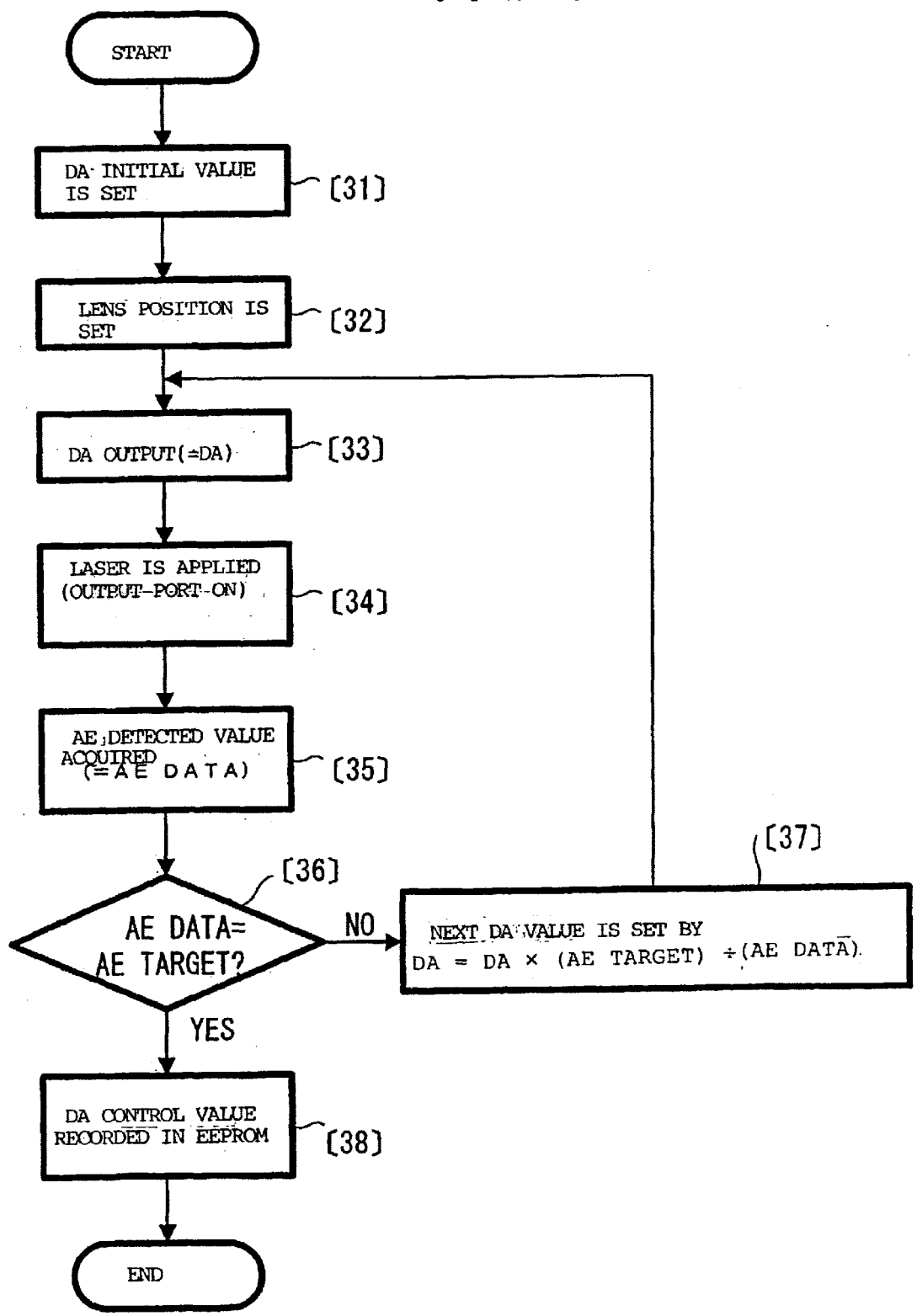
FIG. 7 is a flow chart showing an operation of a laser drive apparatus for adjusting an output of a laser light source according to another embodiment of the present invention.
Figure 8:
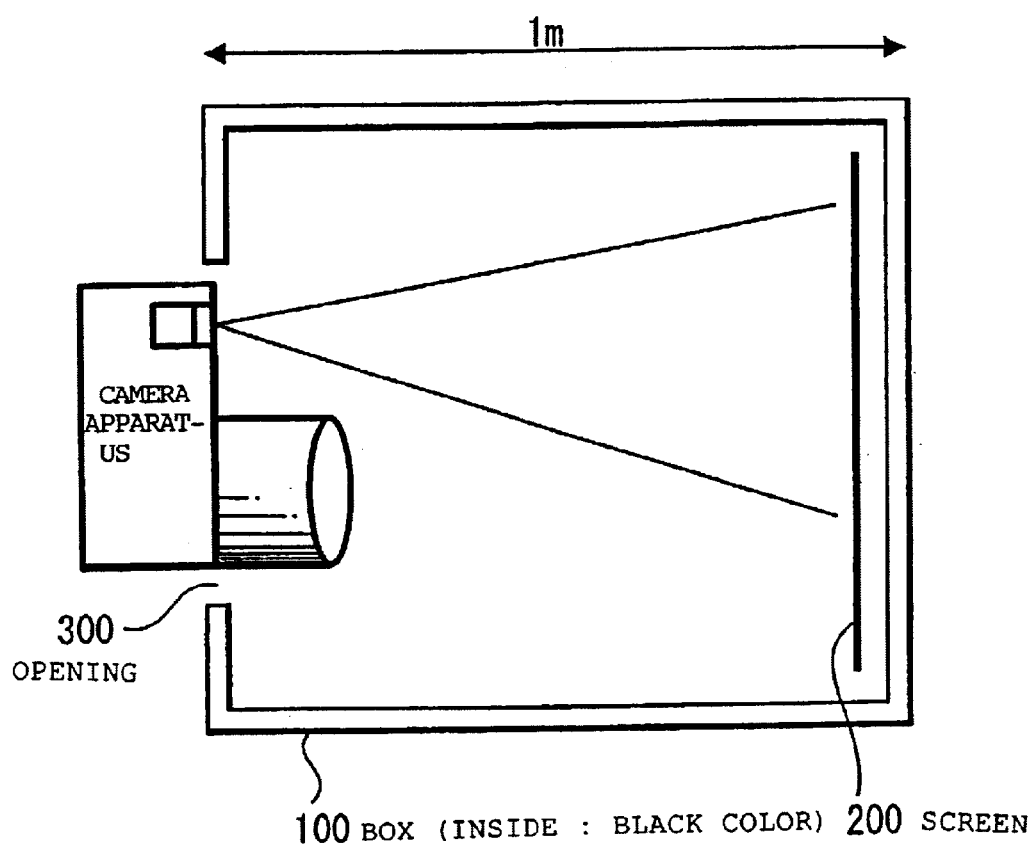
FIG. 8 is a diagram showing environment for the laser drive apparatus to adjust the output of the laser light source.

Moreover, in the above-mentioned apparatus, an output of the laser diode 14 is adjusted as shown in FIGS. 7 and 8. Specifically, FIG. 7 is a flow chart showing operations of the laser drive apparatus to adjust the output of the laser diode 14 according to another embodiment of the present invention. FIG. 8 shows an environment under which the output of the laser diode is adjusted by the laser diode drive apparatus.

Referring to FIG. 8, a screen 200 is attached to one of wall surfaces of a box 100 the inside of which is painted in black. The above-mentioned camera apparatus is disposed through an opening 300 provided on the wall surface opposite to the screen 200. Then, the above-mentioned hologram reproduced image 17 is projected onto the screen 200 and the projected image on this screen 200 is picked up by the CCD 4. Further, the image picked-up output from this CCD 4 is detected to adjust the output from the laser diode 14.

Referring to FIG. 7, upon the start of adjustment operation, a control value (DA) supplied from the micon 8 to the laser driver 13 is set as an initial value at a step [31], and the lens position is set for a distance between the camera apparatus disposed through the opening 300 and the screen 200 at a step [32]. Then, at a step [33], the above-mentioned control value (DA) is supplied through a DA output from the micon 8 to the laser driver 13. At a step [34], the laser diode 14 starts to be driven.

In this way, the laser diode 14 is driven in accordance with the predetermined initial value, the hologram reproduced image 17 based upon the laser output according to this initial value being projected onto the screen 200, and this projected image being picked up by the CCD 4. Then, at a step [35], an automatic exposure (AE) detected value (AE DATA) is detected from the image picked-up output and compared with an AE target value (AE TARGET) at a step [36]. If the two values are not equal to each other (No), then, a control value (DA) is calculated at a step [37].

Specifically, at the step [37], a new control value (DA) is calculated from an expression, e.g. DA=DA×(AE TARGET)÷(AE DATA) and the resultant value is returned to the step [33]. This operation will be repeated until (AE DATA)=(AE TARGET) is satisfied at the step [36]. Then, when the two values become equal to each other (Yes), the control value (DA) is stored in the nonvolatile memory 20 at a step [38] and the operation comes to an end.

In this manner, the value which is used to adjust the dispersion of the output from the laser diode 14 is stored in the nonvolatile memory 20. In actual practical use, the control value (DA) for driving the laser diode 14 is calculated based upon the value stored in this memory 20 and taking other conditions and the like into consideration. In other words, when a user takes a picture, the stored value is read out from this memory 20 to be used as a basic value for adjustment. At the same time, information on stop, zoom position and the like is considered to control the output of the laser diode 14.

The dispersion of the output of the laser diode 14 can be adjusted by using not only the above-mentioned automatic exposure detected value but also a contrast detected value and the like. For example, the control value (DA) in which the contrast detected value forms the target value is stored in the memory. Moreover, if not only the above-mentioned control value but also the detected value itself and other measured values are stored in the memory 20, then such stored values can be used, for example, to check products in manufacturing, and also to check their performances when services or repairs are made after the products have been shipped.

Accordingly, in this embodiment, the output of the laser diode 14 as well as the sensitivity of the CCD 4 is adjusted. Specifically, while the output of the laser diode 14 according to the control value has dispersion between individual products, the sensitivity of the CCD 4 also fluctuates similarly about 20 percent. Accordingly, by adjusting the output of the assembled camera apparatus using the image picked-up output of the CCD 4, the adjustment which absorbs both the dispersion and fluctuation can be carried out.

Figure 9:
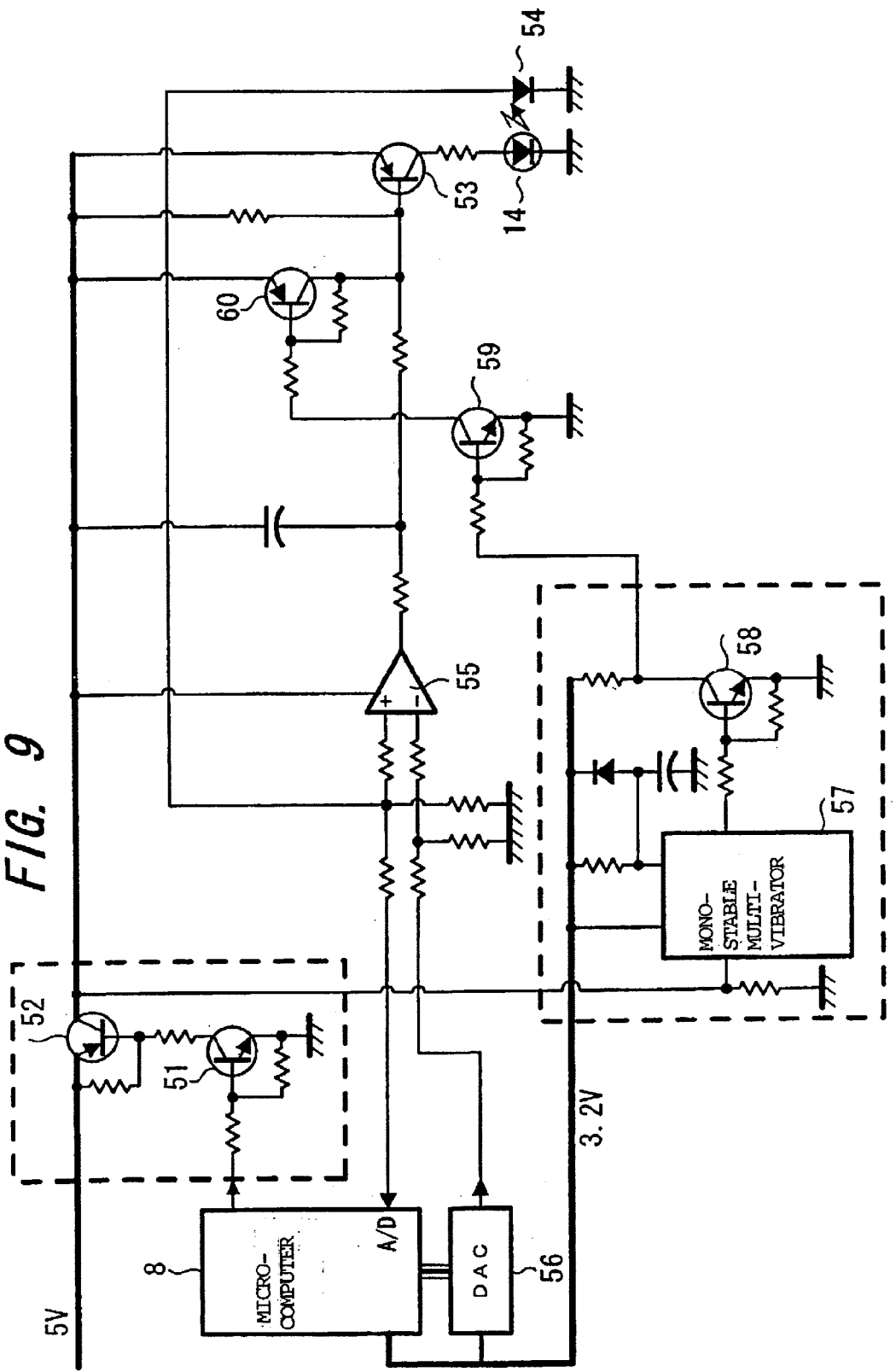
FIG. 9 is a block diagram showing a specific circuit of the laser drive apparatus according to an embodiment of the present invention.

In the above-mentioned apparatus, the laser driver 13 has a specific structure as shown in FIG. 9. FIG. 9 is a block diagram showing a specific circuit of a laser drive apparatus according to an embodiment of the present invention.

Referring to FIG. 9, the laser diode 14 is driven by a power supply of, e.g. 5V, and other circuits including the micon 8 are driven by a power supply of 3.2V. An output signal from the micon 8 is supplied through a switching transistor 51 to a switching transistor 52 provided at the power supply line of 5V, whereby the power supply of 5V is turned on and off. A voltage from the power supply of 5V which is turned on and off is supplied through a transistor 53 to the laser diode 14.

A photodiode 54 is provided in the vicinity of this laser diode 14. An output from this photodiode 54 is supplied to a non-inverting input terminal of an operational amplifier 55, whereas a control value from the micon 8 is supplied to an inverting input terminal of the operational amplifier 55 through a digital-to-analog converter (DAC) 56. An output from this operational amplifier 55 is supplied to the base of the transistor 53. This causes the output of the laser diode 14 to be adjusted so that the output of the photodiode 54 may be kept at a desired value.

An output from the switching transistor 52 is supplied to a falling edge trigger input terminal of a monostable multivibrator (hereinafter abbreviated to "mono-multi") 57. A Q output of this mono-multi 57 is supplied through the transistor 58 to the base of a transistor 59. A signal obtained at the collector of this transistor 59 is supplied to the base of a transistor 60 connected between the 5V power supply line after the switching transistor 52 and the base of the transistor 53.

Thus, in this circuit, when the laser diode 14 is continuously driven, for example, by the output continuously generated from the switching transistor 52, if the time period driving this laser diode exceeds an inverting time of the mono-multi 57, then the transistor 58 is turned on, the transistor 59 being turned off and the transistor 60 being turned on. As a result, the base potential of the transistor 53 rises to make and the transistor 53 turned off, whereby such continuous driving of the laser diode 14 is stopped.

Figure 10:
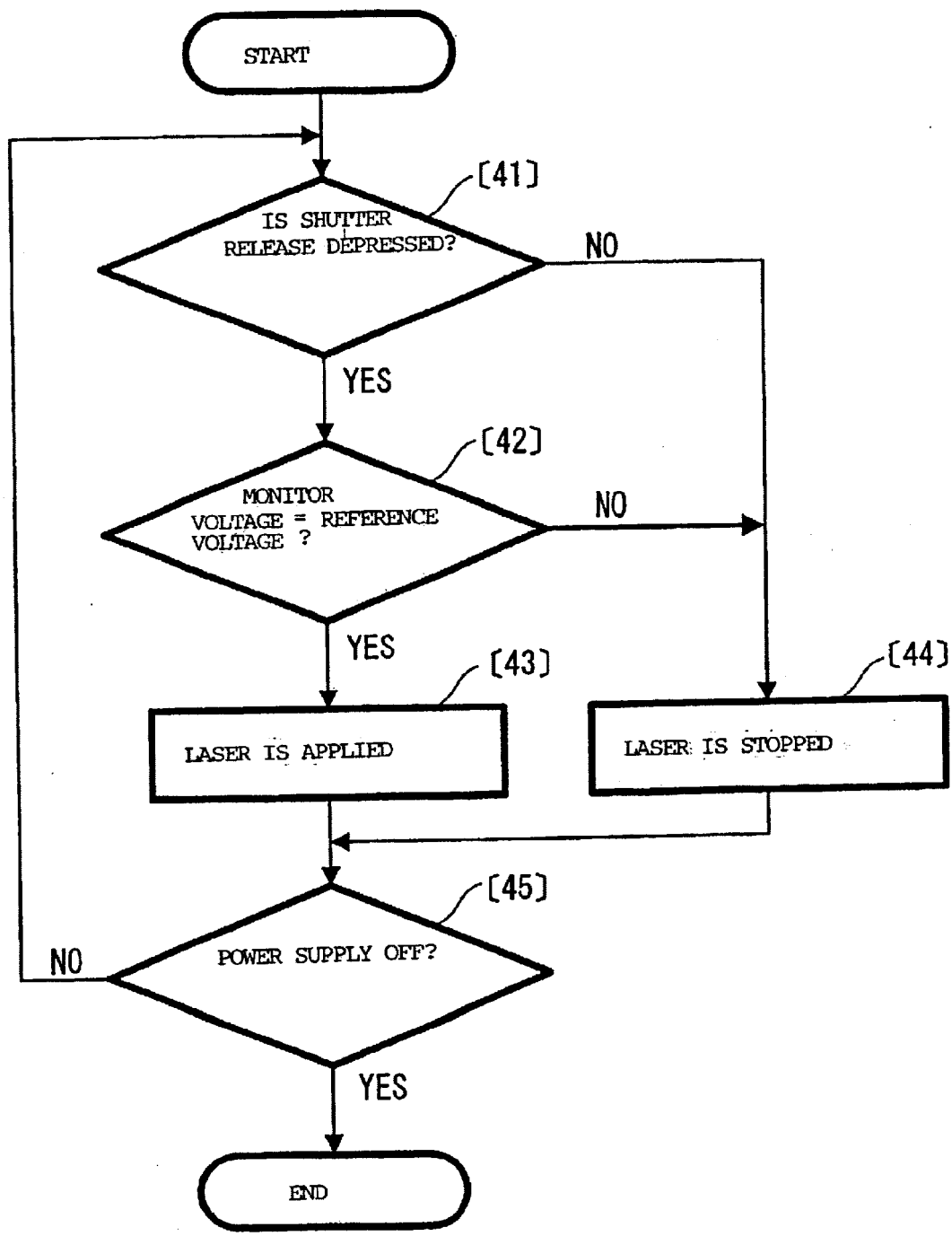
FIG. 10 is a flow chart showing an operation of a laser drive apparatus according to still another embodiment of the present invention.

Further, in the above-mentioned circuit, the output of the photodiode 54 is supplied to an A/D converting input terminal of the micon 8 which monitors the output of the photodiode 54 to operate, for example, as shown in FIG. 10.

FIG. 10 is a flow chart showing operations of a laser drive apparatus according to a still another embodiment of the present invention. Referring to FIG. 10, it is first determined at a step [41] whether or not the shutter release 9 is half depressed. If the shutter release is depressed (Yes), it is determined at a step [42] whether or not a monitor voltage obtained from the photodiode 54 is equal to an arbitrary reference voltage. Then, if the monitor voltage is equal to the reference voltage (Yes), the application of light of laser beams is maintained at the following step [43].

On the contrary, if it is determined at the step [41] that the shutter release 9 is not depressed (No) or if it is determined at the step [42] that the monitor voltage is not equal to the reference voltage (No), then the application of light of laser beams is stopped at a step [44]. Further, it is determined at a step [45] whether or not a command for making the power supply off is issued. If such command for making the power supply off is issued (Yes), then operations come to an end. If no command for making it off is issued (No), then the operation is returned to the step [41].

Accordingly, in this embodiment, when the monitor voltage obtained from the photodiode 54 becomes equal to the arbitrary reference voltage, the application of light of laser beams is stopped. In other words, the generation of light of laser beams is stopped, provided that the output of the monitor means exceeds an arbitrary tolerance limit. This makes it possible to remove such a risk that the laser diode 14 may be broken or degraded in durability by an abnormal driving of the laser diode 14.

Figure 11A:
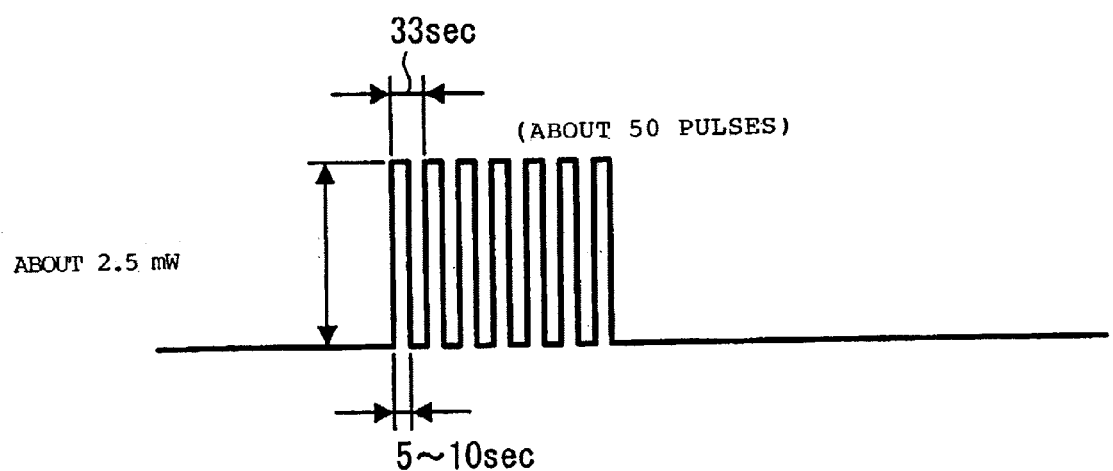
FIGS. 11A and 11B are waveform diagrams of a pulse signal for explaining a laser drive apparatus according to yet another embodiment of the present invention.
Figure 11B:
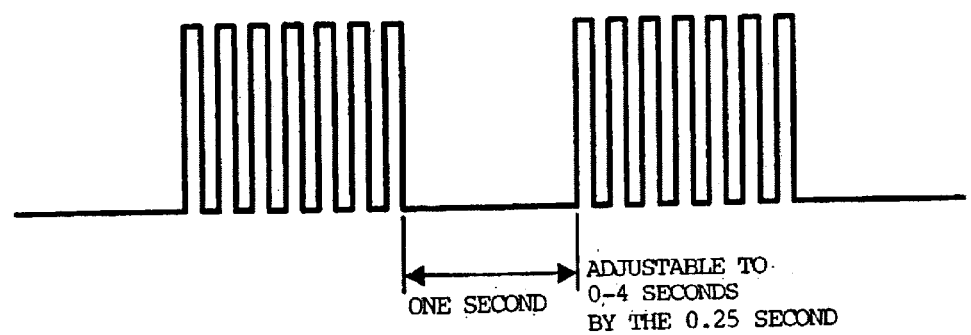

Moreover, in the specific circuit of the laser drive apparatus shown in FIG. 9, a pulse signal, for example, as shown in FIGS. 11A and 11B, is outputted from the micon 8, and the laser diode 14 is driven according to this pulse signal. FIGS. 11A and 11B are waveform diagrams of pulse signals for explaining a laser drive apparatus according to yet another embodiment of the present invention.

In this connection, the micon 8 can form a pulse signal with accuracy, of for example, 0.8 μsec by using a counter, and can control the pulse width, for example, by the 0.16 msec. Moreover, a peak output of the pulse signal can be adjusted, for example, in a range of 0 to 3 mW by the 0.1 mW. Accordingly, for example, based upon the value that is stored in the memory 20 in the above-mentioned operations shown in FIG. 7, the peak output of the pulse signal may be determined and the pulse width may be controlled in consideration of other conditions.

As shown in FIG. 11A, based upon the value stored in the memory 20, the amplitude of the pulse signal is determined to be ,for example, 2.5 mW. Moreover, the pulse width of each pulse may be controlled depending on whether the built-in flash device 19 or an external flash device is used or not. Specifically, for example, when the built-in flash device 19 is in use, the pulse width of the pulse signal is controlled to be 5 msec, and when the external flash device is in use, because long distance to an object is assumed, then the pulse width is controlled to be 10 msec.

Furthermore, when the photography system is based upon the NTSC system, the micon forms the pulse signal at a cycle of 33 msec synchronized with the frame. Because the auto focusing operation can be controlled within 50 frames, it is designed that 50 pulses are generated during one operation at maximum. In this manner, the output of the laser diode 14 is adjusted. Such operations are executed by software of the micon 8.

FIG. 11B shows a waveform of a pulse signal generated when the half depression of the shutter release 9 is repeated. Specifically, when a user takes a picture in a normal mode, because it takes approximately four seconds to store image data in a memory device, an interval of 4 seconds is inevitably formed. Even if the shutter release 9 is half depressed very quickly, it is arranged that an interval of one second is formed. Such operations are also executed by software of the micon 8 and intervals of 0 to 4 seconds are set by the 0.25 second, for example, based upon the values stored in the memory 20.

Moreover, when the laser diode is driven according to the pulse signal as described above, if the inverting time of the above-mentioned mono-multi 57 shown in FIG. 9 is set to be, for example, 33 msec, then the generation of light of laser beams can be stopped when the falling edge of the pulse signal does not occur. Thus, when the means for adjusting a quantity of light of laser beams malfunctions, the laser diode 14 can be stopped from being driven. This makes it possible to remove the risk that the laser diode 14 may be damaged or less durable.

Therefore, in this embodiment, the quantity of light of laser beams can be adjusted satisfactorily by driving the laser light source according on the pulse signal having an arbitrary pulse width. Moreover, the quantity of light of laser beams can also be adjusted by controlling the pulse width depending on the presence or absence of the built-in flash device 19 or the external flash device. Furthermore, when the means for adjusting the quantity of light of laser beams malfunctions, the driving of the laser diode 14 can be stopped to remove the risk that the laser diode 14 may be broken or less durable.

By applying the above-mentioned image projection apparatus, the projection image pattern or the laser drive apparatus to the camera apparatus according to the present invention, the hologram reproduced image having a sufficient contrast can be projected onto the object with small power consumption, so that satisfactory focusing can be attained. At the same time, these apparatus can easily be incorporated into a small electronic still camera and the like.

As described above, the image projection apparatus of the present invention comprises the laser light source for generating light of laser beams and the hologram plate. By projecting onto the object the hologram reproduced image which is obtained by applying light of laser beams to the hologram plate, the hologram reproduced image having good contrast can be projected onto the object with small power consumption, thus allowing satisfactory focusing to be performed. Also, this apparatus can easily be incorporated into a small electronic still camera and the like.

Further, according to the projection image pattern of the present invention, by employing the above-mentioned pattern of FIG. 4, heat produced can be prevented from exceeding the safety standards limit, even if the position of the view point is moved under the respective projection angles. At the same time, because the substantial space between the segments can be reduced by a distance which is half a length of the segment, even if the optical axis of the camera lens is not coincident with the center of the projection image pattern, there can be removed such a risk that a state in which no segment is captured within the detection range may occur.

Moreover, according to the laser drive apparatus of the present invention, because this laser drive apparatus includes the laser light source for generating light of laser beams and the laser light source is stopped from generating the light of laser beams for a fixed time period or longer, on condition that the duration of emitting the light of laser beams exceeds the predetermined time period, for example, when the light of laser beams is applied continuously, the output can be prevented from falling due to heating or the like. Thus, a radiator plate that has so far been used as a conventional countermeasure against heat generation can be dispensed with.

Furthermore, the laser drive apparatus of the present invention includes the laser light source for generating light of laser beams, the means for adjusting the quantity of light of laser beams and the camera means, and further comprises the memory means for storing therein the adjustment value found according to an output of the camera means which has taken the image under previously projected light of laser beams. Thus, the output of the laser light source as well as the sensitivity of the camera means can be adjusted by adjusting the quantity of light of laser beams based upon the stored adjustment value. In other words, the adjustment absorbing dispersions of the output and the sensitivity can be carried out.

Furthermore, the laser drive apparatus of the present invention includes the laser light source for generating light of laser beams and the monitor means for detecting light of laser beams, and is arranged so that the laser light source may be stopped from generating light of laser beams on condition that an output of the monitor means exceeds the arbitrary tolerance limit. Thus, it is possible to remove the risk that the laser light source may be damaged or less durable by an abnormal driving of laser light source.

Moreover, the laser drive apparatus of the present invention includes the laser light source for generating light of laser beams and the means for adjusting the quantity of light of laser beams, and is arranged so that the quantity of light of laser beams may be adjusted by driving the laser light source using the pulse signal having the arbitrary pulse width. Thus, the quantity of light of laser beams can be adjusted satisfactorily, and also the quantity of light of laser beams can be adjusted depending on the presence or absence of the built-in flash device, so that it is possible to remove the risk that the laser light source may be broken or degraded in durability.

Furthermore, the camera apparatus of the present invention includes the projection means having the laser light source and the hologram plate, for projecting onto the object a hologram reproduced image which is obtained by applying light of laser beams from the laser light source to the hologram plate. Thus, the hologram reproduced image having good contrast can be projected onto the object with small power consumption, thereby allowing satisfactory focusing to be attained. At the same time, this apparatus can easily be incorporated into a small electronic still camera or the like.

In short, the above-mentioned camera apparatus has the advantageous effects as follows:

① The focusing is enabled in the AF mode even on condition that the illuminance of an object is low.

② Even an object with low contrast can be brought into focus in the AF mode.

③ Because light of laser beams with high contrast is projected on an object, the focusing is enabled in the auto focus mode with higher accuracy than before.

④ The long-distance projection, which has heretofore been difficult to be made with a conventional auxiliary floodlight having low output, becomes possible.

⑤ Because of a projecting efficiency several times as high as that of the conventional auxiliary floodlight, a low-output projection apparatus can be used for obtaining a sufficient illuminance, so that energy consumption thereof is reduced to a reciprocal of several of conventional energy consumption.

⑥ Because an effective projected area is small, it is less possible that those who are photographed will feel dazzled.

⑦ An object with low illuminance and low contrast, which has been hard to be brought into focus in the conventional manual focus mode, can be brought into focus with ease.

⑧ The projection compatible to both of wide-angle lens mode and telephoto lens mode, which has so far been difficult to be made with the conventional auxiliary floodlight, becomes possible.

Figure 12A:
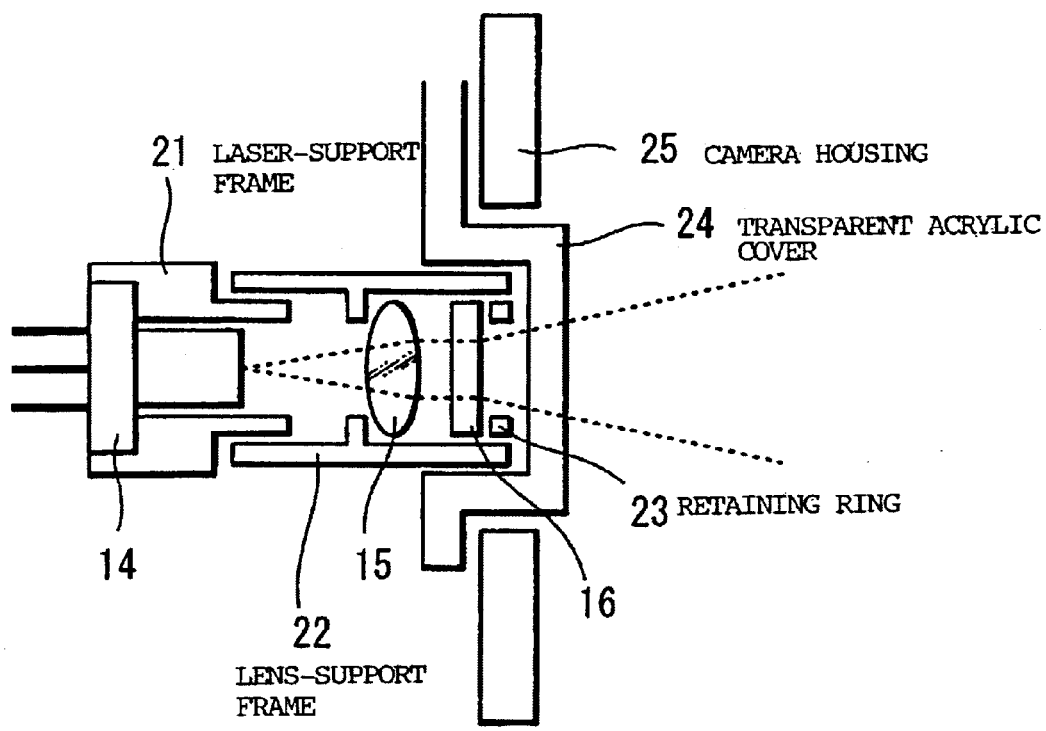
FIGS. 12A and 12B are specific structure diagrams of an image projection apparatus and a camera apparatus according to the present invention.
Figure 12B:
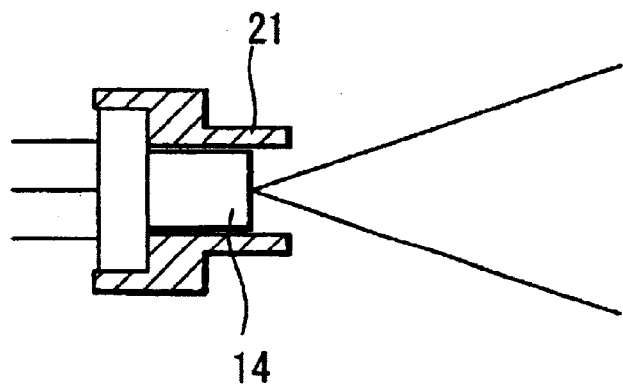

FIGS. 12A and 12B show specific structures of the image projection apparatus and the camera apparatus according to the present invention. Referring to FIG. 12A, only a laser diode 14 for generating light of diffused laser beams is provided within a laser-support frame 21. A condenser 15 which converts light of diffused laser beams to light of parallel laser beams is provided within a lens-support frame 22 which is fitted on the laser-support frame 21. At the same time, a hologram plate 16 is attached to the lens-support frame, e.g. by a retaining ring 23. Thus, these elements are integrally formed as a single unit.

After a clearance between the laser-support frame 21 and the lens-support frame 22 is adjusted, these laser- and lens-support frames 21 and 22 are fixed by an adhesive and the like. Then, these laser- and lens-support frames 21 and 22 are attached to a predetermined position of a camera housing 25 through a transparent acrylic cover 24. In other words, a window covered by the transparent acrylic cover 24 is provided at the predetermined position of the camera housing 25 and the laser-and lens-support frames 21 and 22 are attached to this transparent acrylic cover 24.

As a result, when the laser diode 14 is driven in this state, light of the diffused laser beams thus generated is converted into light of parallel laser beams by the condenser 15 and the light of parallel laser beams is applied to the hologram plate 16, thereby causing a hologram reproduced image (not shown) to be produced. Then, this hologram reproduced image is projected onto the object through the transparent acrylic cover 24 provided at the predetermined position of the camera housing 25.

Accordingly, in this embodiment, the condenser 15 and the hologram plate 16 are integrated into one body unit. Thus, for example, when the lens-support frame 22 is broken as shown in FIG. 12B, both of the condenser 15 and the hologram plate 16 are detached from the laser diode 14. In other words, when the lens-support frame 22 is broken and the hologram plate 16 is detached from the laser diode, the condenser 15 is also detached from the laser diode 14 at the same time.

In this case, because only the light of diffused laser beams is generated by the laser diode 14 from which the condenser lens 15 is detached, even if the light of diffused laser beams is directly applied to an object, when the object is, for example, a man, there will be no risk that a man will feel discomfort due to the dazzling light of parallel laser beams. Therefore, according to this embodiment, even if the hologram plate is detached from the laser diode, there can be removed such a risk that a man may feel discomfort due to the dazzling light of laser beams.

As described above, when a user takes a picture by a still camera in the dark, or the like, it is very difficult to focus in the auto focus mode of the contrast detection system or in the manual focus mode. On the other hand, the image projection apparatus employing the laser light source and the hologram plate involves a risk that a man as an object will feel uncomfortable very much if he sees the dazzling light of parallel laser beams when the hologram plate is detached from the laser diode. According to the present invention, these problems can be overcome with ease.

Figure 13:
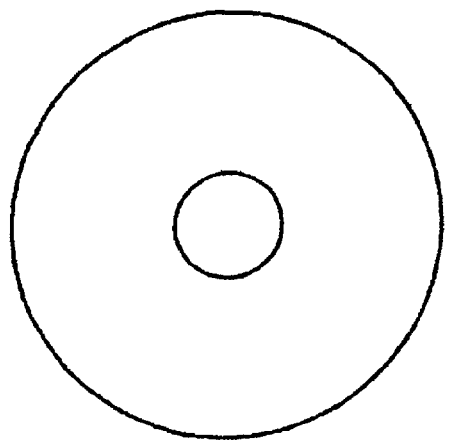
FIG. 13 is a diagram for explaining the above embodiments of the present invention.
Figure 14A:
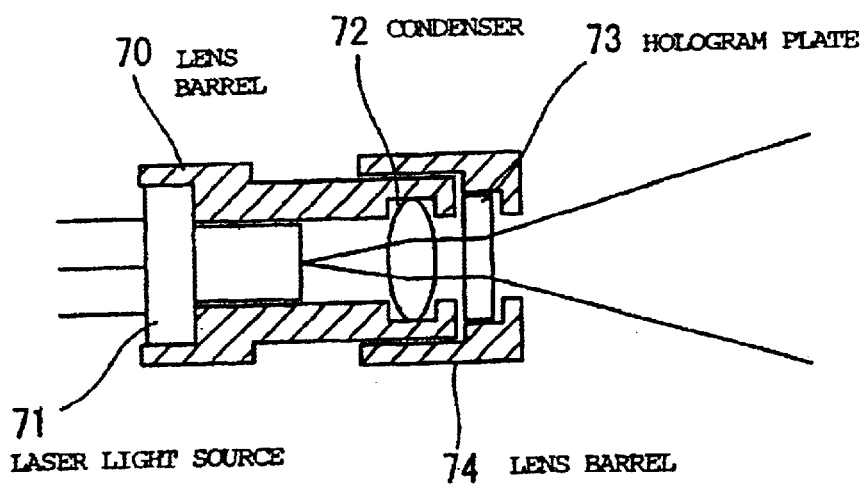
FIGS. 14A and 14B are structure diagrams of conventional image projection apparatus.
Figure 14B:
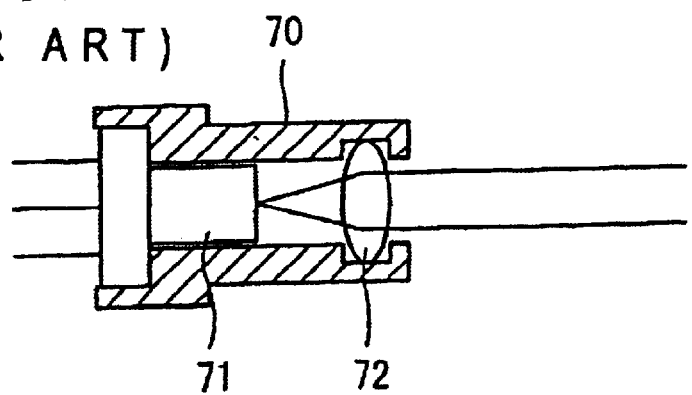

In the above-mentioned apparatus, as shown in FIG. 13, for example, when a small hologram image for taking a picture in the telephoto lens mode and a large hologram image for taking a picture in the wide-angle lens mode are both projected onto the object at the same time, it will be possible to make adapt for both of the wide range projection and the telephotograph projection. Additionally, in FIG. 13, there are projected such hologram images that a projection angle of an inner circle is set at about 5 degrees and a projection angle of an inner circle is set at about 20 degrees. In addition, when the hologram images are composed of fine lines, even the apparatus whose output is small can project with sufficient brightness.

As described above, the image projection apparatus according to the present invention comprises the laser light source for generating the light of diffused laser beams, the condenser for converting the light of diffused laser beams to the light of parallel laser beams and the hologram plate which is irradiated with the light of parallel laser beams. Because the condenser is integrated with the hologram plate into one body unit in the above image projection apparatus, even if the hologram plate is detached from the laser diode, there can be removed such a risk that a man as the object may feel discomfort due to the dazzling light of parallel laser beams.

Moreover, the above-mentioned camera apparatus includes the image projection apparatus which is comprised of the laser light source for generating the light of diffused laser beams, the condenser for converting the light of diffused laser beams to the light of parallel laser beams and the hologram plate irradiated with the light of parallel laser beams, and in which the condenser is integrated with the hologram plate into one body single unit. Thus, by projecting onto the object the hologram reproduced image is which is obtained by applying the light of parallel laser beams to the hologram plate, the hologram reproduced image with sufficient contrast can be projected onto the object, whereby satisfactory focusing can be performed. At the same time, even if the hologram plate is detached from the laser diode, there can be removed the risk that a man as the object may feel discomfort due to the dazzling light of parallel laser beams.

As described above, according to the present invention, the focusing can easily be adjusted when a user takes a picture in the dark or the like. The present invention is not limited to the above-described embodiment and various modifications can be made without departing from the spirit of the present invention.

Thus, according to the present invention, because the image projection apparatus includes the laser light source for generating light of laser beams and the hologram plate and the hologram reproduced image is projected onto the object, which is obtained by applying the light of laser beams to the hologram plate, the hologram reproduced image can be projected onto the object with sufficient contrast with small power consumption and satisfactory focusing can be performed. At the same time, this apparatus can easily be incorporated into , for example, a small electronic still camera.

Moreover, according to the present invention, because the auto focusing operation is carried out using the hologram reproduced image projected onto the object, an extremely satisfactory AF operation can be carried out.

Moreover, according to the present invention, because the image projection apparatus includes the operation means for projecting the hologram reproduced image in the manual focusing operation, the user can execute an extremely good manual focusing operation by visually confirming the hologram reproduced image, and this hologram reproduced image can never hinder the user from taking a picture.

Furthermore, according to the present invention, because the image projection apparatus includes the laser light source for generating the light of diffused laser beams, the condenser for converting the light of diffused laser beams to the light of parallel laser beams and the hologram plate which is irradiated with the light of parallel laser beams, and the condenser and the hologram plate are integrated with each other into one body unit, even if the hologram plate is detached from the laser diode, it will be possible to remove the risk that a man as the object may feel discomfort due to the dazzling light of parallel laser beams.

Moreover, according to the present invention, because the hologram reproduced image is projected onto the object, which is obtained by applying the light of parallel laser beams to the hologram plate, focusing can be carried out satisfactorily by projecting the hologram reproduced image with sufficient contrast onto the object. At the same time, even if the hologram plate is detached from the laser diode, it will be possible to remove the risk that a man as the object may feel discomfort due to the dazzling light of parallel laser beams.

Moreover, according to the present invention, because the auto focusing operation is carried out using the hologram reproduced image projected onto the object, the extremely good AF operation can be carried out. At the same time, even if the hologram plate is detached from the laser diode, it will be possible to remove the risk that a man as the object may feel discomfort due to the dazzling light of parallel laser beams.

Furthermore, according to the present invention, because the above-mentioned pattern shown in FIG. 4 is employed, even if the position of the view point is moved under the respective projection angles, no heat is produced beyond the safety standards limit, and the substantial space between the segments can be reduced by the distance equal to half of the length of the segment. Thus, even if the optical axis of the camera lens does not coincide with the center of the projected image pattern, it is possible to remove such a risk that a state in which no segment is captured within the detection range may happen.

Moreover, according to the present invention, because the central light spot is eliminated from a predetermined number of the light spots forming the first segment, the luminance of the central light spot of the first segment can be prevented from being increased due to the zero-order light, and hence the satisfactory detection can be carried out.

Furthermore, the present invention includes the laser light source for generating the light of laser beams and is arranged so that the laser light source may be stopped from generating the light of laser beams for a fixed time period or longer, provided that the laser light source continues emitting the light of laser beams over a predetermined time period. Thus, when the application of the light of laser beams to the object continues, the output of the apparatus can be prevented from falling due to produced heat or the like. Therefore, it is possible to dispense with the radiator plate and the like which has been used so far as the prior-art countermeasure against heat generation.

Moreover, according to the present invention, because the hologram reproduced image is projected onto the object, which is obtained by applying the light of laser beams to the arbitrary hologram plate, the hologram reproduced image with sufficient contrast can be projected onto the object by small power consumption, whereby satisfactory focusing can be carried out. At the same time, this apparatus can easily be incorporated into a small electronic still camera and the like.

Furthermore, according to the present invention, the laser drive apparatus including the laser light source for generating the light of laser beams, the means for adjusting the quantity of light of laser beams and the camera means further comprises the means for storing therein the adjustment value found according to the output of the camera means which takes an image after projecting the light of laser beams. Thus, the output of the laser light source as well as the sensitivity of the camera means is adjusted by adjusting the quantity of light of the laser beams based upon the stored adjustment value, thus enabling such adjustment that absorbs the dispersions of both the sensitivity of camera means and the output of laser light source.

Moreover, according to the present invention, the hologram reproduced image with sufficient contrast can be projected onto the object with small power consumption by projecting onto the object the hologram reproduced image which is obtained by applying the light of laser beams to the hologram plate, so that satisfactory focusing can be carried out. At the same time, this apparatus can easily be incorporated into, for example, a small electronic still camera.

Moreover, according to the present invention, because the quantity of light of laser beams is adjusted based upon the automatic exposure detected value detected from the video signal obtained by the camera means, the circuit can be diverted to the existing camera apparatus so that the quantity of light of the laser beams may be adjusted satisfactorily.

Moreover, according to the present invention, because the quantity of light of laser beams is adjusted based upon the contrast detected value detected from the video signal obtained by the camera means, the circuit can be diverted to the existing camera apparatus so that the quantity of light of laser beams may be adjusted satisfactorily.

Furthermore, according to the present invention, because the apparatus includes the laser light source for generating the light of laser beams and the monitor means for detecting the light of laser beams and is arranged so that the laser light source may be stopped from generating the light of laser beams on condition that the output of the monitor means exceeds an arbitrary tolerance limit, it is possible to remove the risk that the laser light source may be broken or less durable owing to abnormal driving of the laser light source.

Moreover, according to the present invention, because the hologram reproduced image with sufficient contrast can be projected onto the object with small power consumption by projecting onto the object the hologram reproduced image obtained by applying the light of laser beams to an arbitrary hologram plate, satisfactory focusing can be done. At the same time, this apparatus can easily be incorporated into a small electronic still camera, and the like.

Furthermore, according to the present invention, the laser drive apparatus includes the laser light source for generating the light of laser beams and the means for adjusting the quantity of light of laser beams and is designed to adjust the quantity of light of laser beams by driving the laser light source according to the pulse signal having the arbitrary pulse width. Thus, the quantity of light of laser beams can be adjusted satisfactorily and also can be adjusted satisfactorily depending on the presence or absence of the built-in flash device. At the same time, it is possible to remove the risk that the laser light source may be broken or degraded in durability.

Moreover, the present invention includes an arbitrary lighting means and adjusts the quantity of light of laser beams by controlling the pulse width of the pulse signal according to in response to the quantity of light of the lighting means. Thus, satisfactory adjustment of the quantity of light can be made depending on whether the built-in flash device is used or not.

Moreover, according to the present invention, because there is provided the means for stopping the laser light source from generating the light of laser beams when the means for adjusting the quantity of light of the laser beams malfunctions, it is possible to remove the risk that the laser light source may be broken or degraded in durability.

Furthermore, according to the present invention, because the hologram reproduced image is projected onto the object, which is obtained using the laser light source and the hologram plate, the hologram reproduced image with sufficient contrast can be projected onto the object with small power consumption, and satisfactory focusing can be carried out in the auto focus mode of the contrast detection system or in the manual focus mode. At the same time, this apparatus can easily be incorporated into, for example, a small electronic still camera.

Moreover, according to the present invention, because the auto focusing operation is performed by using the projected image of the hologram reproduced image projected onto the object; there can be performed the extremely satisfactory AF operation.

Moreover, according to the present invention, because the apparatus includes the operation means for projecting the hologram reproduced image in the manual focus mode, the user can execute the extremely satisfactory manual focusing operation by visually confirming the hologram reproduced image, and this hologram reproduced image will never hinder the user from taking a picture.

Moreover, according to the present invention, the laser light source is stopped from generating the light of laser beams for a fixed time period or longer on condition that the duration in which the laser light source continues emitting the light of laser beams exceeds the predetermined time period. Thus, when the laser light source continues emitting the light of laser beams for example, the output of the apparatus can be prevented from falling due to produced heat and the like, so that the radiator plate or the like that has so far been used as the conventional countermeasure against produced heat can be unnecessary.

Moreover, according to the present invention, the apparatus includes the means for adjusting the quantity of light of laser beams, the camera means and the means for storing therein the adjustment value found depending on the output of the camera means which takes an image after projecting the light of laser beams. Therefore, the output of the laser light source is adjusted together with the sensitivity of the camera means by adjusting the quantity of light of laser beams based upon the above-mentioned adjustment value thus stored, and hence there is carried out the adjustment which can absorb dispersions of both the output of laser light source and the sensitivity of the camera means.

Moreover, according to the present invention, because the quantity of light of laser beams is adjusted based upon the automatic exposure detected value detected from the video signal obtained when the user takes a picture by the camera means, the circuit can be diverted to the existing camera apparatus for satisfactory adjustment of the quantity of light of laser beams.

Moreover, according to the present invention, because the quantity of light of laser beams is adjusted based upon the contrast detected value detected from the video signal obtained when the user takes a picture by the camera means, the circuit can be diverted to the existing camera apparatus for satisfactory adjustment of the quantity of light of laser beams.

Moreover, according to the present invention, because the apparatus includes the monitor means for detecting the light of laser beams and the laser light source is stopped from generating the light of laser beams on condition that the output of the monitor means exceeds an arbitrary tolerance limit, there can be removed the risk that the laser light source may be broken or degraded in durability owing to abnormal driving of the laser light source.

Moreover, according to the present invention, because the apparatus includes the means for adjusting the quantity of light of laser beams and this means adjusts the quantity of light of laser beams by driving the laser light source with the pulse signal having an arbitrary pulse width, not only the quantity of light of laser beams can be adjusted satisfactorily, but also the quantity of light of laser beams can be adjusted depending on whether the built-in flash device is used or not. Thus, there can be removed the risk laser light source will be broken or that the degraded in durability.

Moreover, according to the present invention, because the apparatus further includes an arbitrary lighting means and adjusts the quantity of light of laser beams by controlling the pulse width according to the quantity of light of the lighting means, satisfactory adjustment of the quantity of light of laser beams can be made depending on whether the built-in flash device is used or not.

Moreover, according to the present invention, because the apparatus includes the means for stopping the laser light source from generating the light of laser beams when the means for adjusting the quantity of light of laser beams malfunctions, it is possible to remove the risk that the laser light source will be broken or less durable.

Furthermore, according to the present invention, because the hologram reproduced image, which is obtained by using the laser light source and the hologram plate, is projected onto the object and this hologram plate is integrated with the condenser for converting the light of laser beams into one body unit, the hologram reproduced image with sufficient contrast can be projected onto the object so that satisfactory focusing may be made. At the same time, even if the hologram plate is detached from the laser diode, it will be possible to remove such a risk that a man as the object may feel discomfort due to the dazzling light of laser beams.

Moreover, according to the present invention, because the auto focusing operation is performed by using the projected image of the hologram reproduced image projected onto the object, the extremely good AF operation can be carried out.

Furthermore, according to the present invention, because the apparatus includes the operation means for projecting the hologram reproduced image in the manual focus mode, a user can execute the extremely good manual focusing operation by visually confirming the hologram reproduced image. Then, this hologram reproduced image will never hinder the user from taking a picture.

As described above, when a user takes a picture by a still camera, for example, in the dark, it is very difficult for the user to focus on the object in the auto focus mode of the contrast detection system or in the manual focus mode. On the other hand, the conventional camera apparatus using the auxiliary floodlight cannot focus on the object sufficiently. Moreover, because this apparatus has large power consumption, it cannot be incorporated into a small electronic still camera and the like. In addition, when the hologram plate is detached from the laser diode, there is the risk that a man as the object may feel uncomfortable very much if he sees the dazzling light of parallel laser beams. According to the present invention, these problems can be overcome with ease.

What is claimed is:

1. An image projection apparatus that is used with a camera apparatus and has a function to project onto an object a hologram reproduced image that is obtained by applying light of laser beams to a hologram plate, said image projection apparatus comprising:

a laser light source for generating light of diffused laser beams;

a lens for converting said light of diffused laser beams to light of parallel laser beams; and said hologram plate irradiated with said light of parallel laser beams, wherein said lens is integrated with said hologram plate into one body unit.

2. A projection image pattern that is projected by an image projection apparatus that is used with a camera apparatus, possesses a function to project onto an object a hologram reproduced image that is obtained by applying light of laser beams to a hologram plate, and is comprised of a laser light source for generating said light of laser beams and said hologram plate, said projection image pattern being composed of at least part of first to fifth segments, that are comprised of one or a plurality of segments, each segment including a predetermined number of light spots arrayed in a straight line, wherein said first segment is provided in the center of a projected image at an angle of approximately 45 degrees with horizontal and vertical axes of an image pickup plane;

four said second segments are provided, at right angles with said first segment, at each vertex of a square that circumscribes a circle centered at the center of said first segment and has a predetermined length of diameter;

eight said third segments are provided, in parallel with said first segment, at each vertex and at each vertex and at a midpoint in each side of a square that circumscribes a circle centered at the center of said first segment and has a diameter twice the predetermined length;

twelve said fourth segments are provided, at right angles with said first segment, at each vertex and at points trisecting each side of a square that circumscribes a circle centered at the center of said first segment and has a diameter three times the predetermined length;

four said fifth segments are provided, in parallel with said first segment, at a midpoint of each side of a square that circumscribes a circle centered at the center of said first segment and has a diameter four times the predetermined length.

3. A projection image pattern according to claim 2, wherein the central light spot is removed from said predetermined number of light spots forming said first segment.

4. A camera apparatus comprising an image projection apparatus including:

a laser light source for generating light of diffused laser beams;

a lens for converting said light of diffused laser beams to light of parallel laser beams; and a hologram plate irradiated with said light of parallel laser beams and integrated with said lens into one body unit, wherein said image projection apparatus projects onto an object a hologram reproduced image that is obtained by applying said light of parallel laser beams to said hologram plate, and said camera apparatus performs an auto focusing operation by using a projected image of said hologram reproduced image projected onto said object.

5. A camera apparatus comprising an image projection apparatus including:

a laser light source for generating light of diffused laser beams;

a lens for converting said light of diffused laser beams to light of parallel laser beams; and a hologram plate irradiated with said light of parallel laser beams and integrated with said lens into one body unit, wherein said image projection apparatus projects onto an object a hologram reproduced image that is obtained by applying said light of laser beams to said hologram plate; and operation means for projecting said hologram reproduced image in a manual focus mode is provided.

* * * * *